United States Patent
Bassi et al.

(10) Patent No.: US 11,005,485 B2
(45) Date of Patent: May 11, 2021

(54) FREQUENCY MULTIPLIER AND METHOD FOR FREQUENCY MULTIPLYING

(71) Applicant: Infineon Technologies AG, Neubiberg (DE)

(72) Inventors: Mateo Bassi, Villach (AT); Fabio Padovan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/447,599

(22) Filed: Jun. 20, 2019

(65) Prior Publication Data

US 2019/0393882 A1 Dec. 26, 2019

(30) Foreign Application Priority Data

Jun. 21, 2018 (DE) .......................... 102018210089.6

(51) Int. Cl.
| | | |
|---|---|---|
| *H03L 7/099* | (2006.01) | |
| *H03K 3/03* | (2006.01) | |
| *H03L 7/24* | (2006.01) | |
| *H03B 19/14* | (2006.01) | |

(52) U.S. Cl.
CPC .......... *H03L 7/0996* (2013.01); *H03B 19/14* (2013.01); *H03K 3/0315* (2013.01); *H03L 7/24* (2013.01)

(58) Field of Classification Search
CPC .... H03B 19/14; H03K 3/0315; H03L 7/0995; H03L 7/0996; H03L 7/20; H03L 7/24
USPC ........ 375/327, 373, 375; 327/144, 145, 147, 327/156; 331/12, 22, 34, 36 C, 36 L, 331/1 A, 48, 50, 53, 57, 60
See application file for complete search history.

(56) References Cited

U.S. PATENT DOCUMENTS

| | | | |
|---|---|---|---|
| 7,302,011 B1 | 11/2007 | Granger-Jones | |
| 7,492,850 B2 * | 2/2009 | Menolfi | ................. H03D 3/006 327/141 |
| 9,438,456 B1 | 9/2016 | Chakraborty et al. | |
| 9,444,435 B1 * | 9/2016 | Monaco | ............... H03K 3/0322 |
| 2002/0079938 A1 * | 6/2002 | Saeki | ..................... H03K 5/133 327/165 |
| 2004/0257129 A1 | 12/2004 | Kwok | |
| 2005/0245200 A1 | 11/2005 | Kluge et al. | |
| 2009/0051394 A1 | 2/2009 | Reynolds et al. | |
| 2009/0081961 A1 * | 3/2009 | Rofougaran | .............. H03L 7/24 455/76 |
| 2009/0175116 A1 * | 7/2009 | Song | ..................... H03L 7/0805 365/233.12 |
| 2010/0013530 A1 | 1/2010 | Kim et al. | |

(Continued)

FOREIGN PATENT DOCUMENTS

| | | |
|---|---|---|
| EP | 1545007 A1 | 6/2005 |
| WO | 03005585 A1 | 1/2003 |

*Primary Examiner* — Young T. Tse
(74) *Attorney, Agent, or Firm* — Harrity & Harrity, LLP

(57) ABSTRACT

A frequency multiplier comprises a phase generator configured to receive an oscillation signal and to provide at phase generator outputs versions of the oscillation signal, which are phase-shifted with respect to each other. An injection-locked ring oscillator comprises a plurality of stages, wherein each of the phase generator outputs is coupled to a different stage of the plurality of stages for multi-point injection. A combiner combines output signals of the plurality of stages of the injection-locked ring oscillator into a signal having a frequency which is a multiple of a frequency of the oscillation signal.

20 Claims, 6 Drawing Sheets

(56) References Cited

U.S. PATENT DOCUMENTS

| | | |
|---|---|---|
| 2012/0157005 A1 | 6/2012 | Bardin et al. |
| 2013/0058384 A1* | 3/2013 | Otis .................... H03K 3/0315 375/219 |
| 2013/0099871 A1* | 4/2013 | Wang ................... H03K 3/0315 331/57 |
| 2013/0266103 A1 | 10/2013 | Bae et al. |
| 2015/0288398 A1 | 10/2015 | Wu et al. |
| 2016/0099720 A1 | 4/2016 | Bashir et al. |
| 2016/0373094 A1 | 12/2016 | Yayla et al. |
| 2017/0104508 A1 | 4/2017 | Mukundagiri et al. |
| 2018/0115410 A1* | 4/2018 | Tajalli ................... H04L 7/0087 |

\* cited by examiner

FREQUENCY MULTIPLIER AND METHOD FOR FREQUENCY MULTIPLYING

CROSS REFERENCE TO RELATED APPLICATION

This application claims priority under 35 U.S.C. § 119 to German Patent Application No. 102018210089.6 filed on Jun. 21, 2018, the content of which is incorporated by reference herein in its entirety.

FIELD

The present application relates to a frequency multiplier and a method for frequency multiplying and, for example, a frequency multiplier and a method for frequency multiplying to generate an output signal having a frequency which is a multiple of a frequency of an oscillation signal.

BACKGROUND

Generally, a frequency multiplier is an electronic circuit that generates an output signal whose output frequency is a multiple of its input frequency. For example, in every communication/radar system, if the frequency of a local oscillator is lower than a desired carrier frequency, a frequency multiplier may be used to generate the carrier frequency from the frequency of the local oscillator. The frequency multiplier generates at its output the desired frequency $f_{out}=N \cdot f_{lo}$, where $f_{out}$ is the desired output frequency, $f_{lo}$ is the frequency of the local oscillator and N is the multiplication factor. In some examples, the multiplier produces a harmonic at $f_{out}$ only and suppresses all other harmonics with infinite harmonic rejection. Practically, this may not be true and together with the desired harmonic $f_{out}$, several or all harmonics multiples of $f_{lo}$ are present in the output signal if no further measures for harmonic rejection are taken.

A first common approach to achieve high harmonic rejection in a frequency multiplier is shown in FIG. 7. A voltage controlled oscillator (VCO) 10 generates a differential output signal 12 having an oscillation frequency $f_{lo}$, which may be a variable oscillation frequency. The differential output signal 12 is provided to a frequency multiplier 14. The frequency multiplier 14 generates at its output an output signal 16 having a frequency which is the frequency of the input signal times a multiplication factor N. The multiplication factor N may be a natural number greater or equal to 2. The output of the frequency multiplier 14 is connected to the input of a band-pass filtering stage 18 cascaded with the multiplier. The pass band of the band-pass filtering stage is centered at $f_{out}=N \cdot f_{lo}$ and, therefore, the band-pass filtering stage rejects the other harmonics. Thus, an output signal in which the harmonics are suppressed is achieved at the output 20 of the band-pass filtering stage. However, in order to achieve a high rejection of the harmonics, a filter with a high quality factor is desirable. Such a kind of filter is difficult to realize and, even if such a filter is realized, it is difficult to center the pass band at $f_{out}$ over process, voltage and temperature (PVT) variations. In addition, at RF/MMW frequencies (RF=radio frequency, MMW=millimeter wave), the band-pass filter would be a LC resonator and, thus, the rejection would be limited by the order of the filter.

FIG. 8 shows another common approach for harmonic rejection. As it is shown in FIG. 8, the output of the frequency multiplier 14 is coupled to an injection locking stage 22 comprising an oscillator running at $f_{out}$. The oscillator may be a LC-VCO (VCO=voltage controlled oscillator). The positive feedback behavior of the injection locking stage 22 helps in rejecting the harmonics to output an output signal having a frequency $f_{out}=N \cdot f_{lo}$ at an output 24 of the injection locking stage 22. However, in order to achieve a proper locking, the free running frequency of the LC-VCO must be as close as possible to $f_{out}$, which is difficult to achieve due to process, voltage and temperature variations. Moreover, the harmonic rejection behavior of the LC-VCO is high inside the locking range, but limited to the band-pass behavior of the LC-VCO tank outside the locking range. Since the locking range is usually narrow, wherein typical numbers for LC-VCOs are around 15%, the harmonic rejection is limited.

SUMMARY

There is still room for improvements in achieving high harmonic rejection over process, voltage and temperature variations and over a wide input frequency range.

Examples of the present disclosure provide a frequency multiplier comprising a phase generator configured to receive an oscillation signal and to provide at phase generator outputs versions of the oscillation signal, which are phase-shifted with respect to each other. The frequency multiplier comprises an injection-locked ring oscillator comprising a plurality of stages, wherein each of the phase generator outputs is coupled to a different stage of the plurality of stages for multi-point-injection. The frequency multiplier further comprises a combiner configured to combine output signals of the plurality of stages of the injection-locked ring oscillator into a signal having a frequency which is a multiple of a frequency of the oscillation signal.

Examples of the present disclosure provide a method for frequency multiplying comprising generating versions of an oscillation signal, which are phase-shifted with respect to each other, multi-point injection-locking a ring oscillator using the generated versions of the oscillation signal, and combining output signals of stages of the ring oscillator into a signal having a frequency which is a multiple of a frequency of the oscillation signal.

Thus, in examples of the present disclosure, the ring oscillator may clean up phase errors in the phase-shifted versions of the oscillation signal over process, voltage and temperature variations and, thanks to the multi-point injection, over a wide frequency range. Thus, the signals which are combined subsequently may be equally spaced in phase and the combiner may produce at its output an output signal having a frequency, which is a specific multiple of the input frequency with high harmonic rejection.

BRIEF DESCRIPTION OF THE DRAWINGS

Examples of the disclosure will be described using the accompanying drawings, in which.

DETAILED DESCRIPTION

In the following, examples of the present disclosure will be described in detail using the accompanying drawings. It is to be pointed out that the same elements or elements that have the same functionality are provided with the same or similar reference numbers, and that a repeated description of elements provided with the same or similar reference numbers is typically omitted. Hence, descriptions provided for elements having the same or similar reference numbers are mutually exchangeable. In the following description, a plurality of details is set forth to provide a more thorough explanation of examples of the disclosure. However, it will be apparent to one skilled it the art that other examples may be practiced without these specific details. In other instances, well-known structures and devices are shown in block diagram form rather than in detail in order to avoid obscuring examples described herein. In addition, features of the different examples described herein may be combined with each other, unless specifically noted otherwise.

Figure 1:
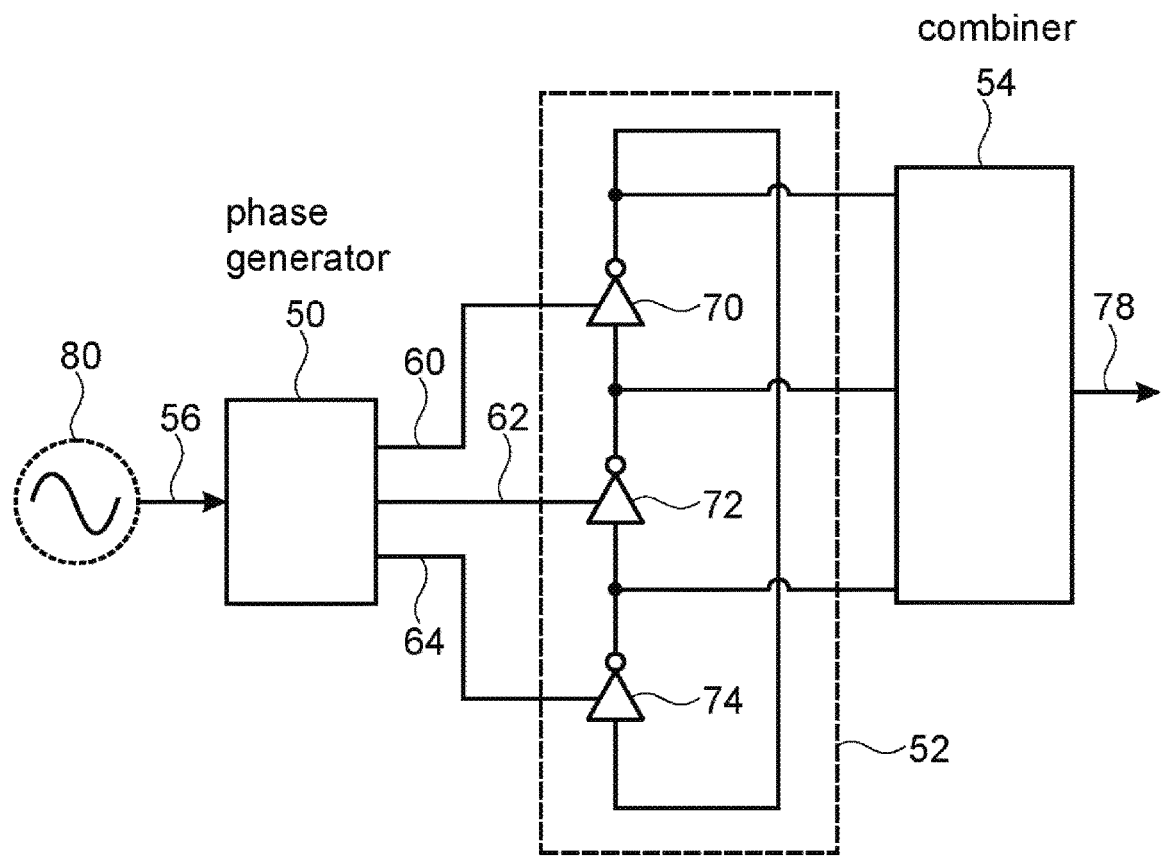
FIG. 1 shows a schematic diagram of a frequency multiplier according to an example of the present disclosure.

FIG. 1 shows an example of a frequency multiplier comprising a phase generator 50, an injection-locked ring oscillator 52 and a combiner 54. The phase generator 50 is configured to receive an oscillation signal 56. The oscillation signal 56 may be generated by a local oscillator. In examples, the oscillation signal 56 has a varying frequency. In examples, the oscillation signal 56 is a frequency modulated signal, such as a local oscillator signal used to generate frequency ramps in a frequency modulated continuous wave (FMCW) radar system.

The phase generator 50 is configured to generate at phase generator outputs 60, 62 and 64 versions of the oscillation signal 56, which are phase-shifted with respect to each other. In examples, the phase generator 50 comprises N phase generator outputs, wherein N is an integer number equal to or larger than 2. In some examples, N is a natural number equal to or larger than 3. In the example shown in FIG. 1, N is 3. Generally, the phase generator 50 is configured to generate a set of N signals, by generating a signal for each integer j such that 0≤j≤(N−1). Each signal within the set has the same frequency and approximately equal amplitude and a phase equal to (360/N)·j degrees.

The injection-locked ring oscillator 52 comprises a number of stages, wherein three stages 70, 72 and 74 are shown in FIG. 1. Of course, the injection-locked ring oscillator may have in other implementations a different number of stages. In examples, the injection-locked ring oscillator comprises N stages, wherein N corresponds to the number of phase generator outputs, e.g., the number of generated phase-shifted versions of the oscillation signal. Each of the phase generator output 60, 62 and 64 is coupled to a different stage 70, 72 and 74 of the ring oscillator for multi-point injection. Compared to the classic single-point injection, where one output phase of the output of the phase generator is injected into the ring oscillator 52, multi-point injection injects a phase-shifted version of the signal in each ring oscillator stage (cell). Therefore, the injection-locking range is much wider in frequency and a correct operation (e.g. phase clean up) can be provided over a wide frequency range. In examples, a current corresponding to the respective generated version of the oscillation signal is injected into the respective stage of the injection-locked ring oscillator to achieve the multi-point injection locking. An output of each stage of the ring oscillator 52 is coupled to an associated input of combiner 54. Combiner 54 is configured to combine output signals of the stages 70, 72 and 74 of the injection-locked ring oscillator 52 into an output signal 78 having a frequency which is a multitude of the frequency of the oscillation signal.

In examples, the phase generator 50 comprises N phase generator outputs 60, 62, 64, wherein the generated versions of the oscillation signal are phase shifted by a phase shift of 360 degrees/N with respect to each other when the injection-locked ring oscillator comprises N stages 70, 72, 74. After combining the respective output signal of the N stages a signal is generated with N times a frequency of the oscillation signal. In examples, the frequency of the output signal is an integer multiple of the frequency of the oscillation signal.

In some implementations, the oscillation signal is a differential signal, e.g., including two signals having a phase difference of 180 degrees therebetween. In such examples, the signal processing is a differential signal processing. Consequently in such implementations, the phase generator is a differential phase generator, the phase generator outputs are differential phase generator outputs, the injection-locked ring oscillator is a differential injection-locked ring oscillator and the combiner is a differential combiner. In other words, the corresponding circuits are configured to process differential signals. In other examples, the oscillation signal may be a single-ended signal and the respective electronic circuits are configured to process single-ended signals.

In the following, examples of the present disclosure are described referring to differential signals. However, it is clear that corresponding circuits may also be configured to process single ended signals.

Examples of the present disclosure provide a signal generator comprising a frequency multiplier and an oscillator 80 (shown with broken lines in FIG. 1). The oscillator 80 may be a local oscillator. Oscillator 80 is configured to generate the oscillation signal 56. Oscillator 80 generates oscillation signal 56 with a frequency $f_{lo}$. As explained above, oscillator 80 may be a voltage controlled oscillator configured to provide a frequency modulated oscillation signal, such as an oscillation signal comprising a frequency ramp.

Figure 2:
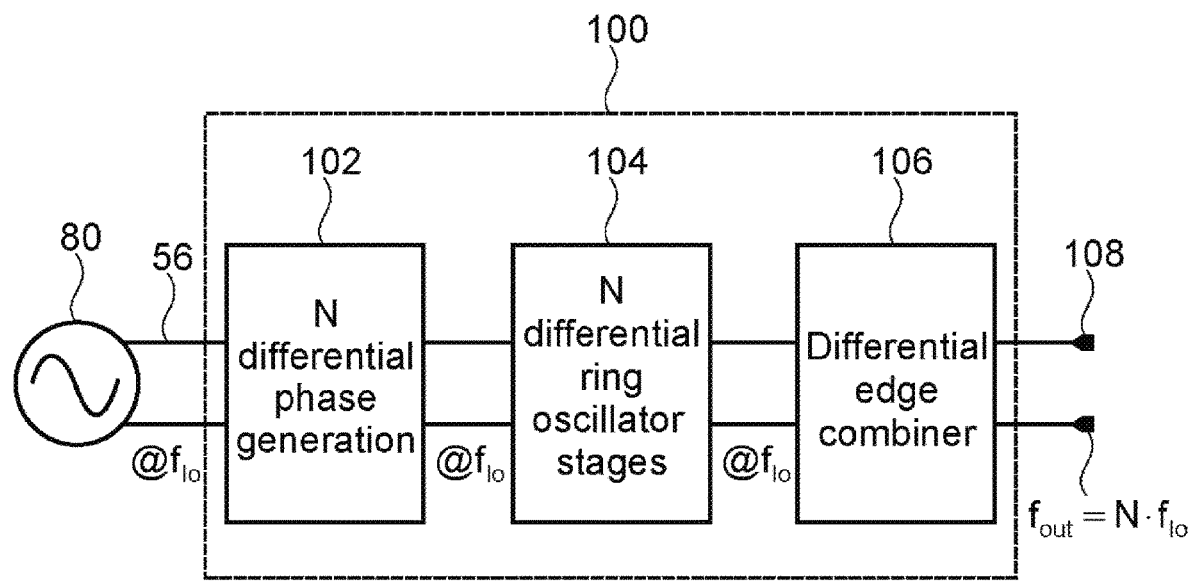
FIG. 2 shows a schematic diagram of a frequency multiplier according to another example of the present disclosure.

FIG. 2 shows an example of a signal generator comprising a frequency multiplier 100 and an oscillator 80. Oscillator 80 may be a local oscillator (LO). Oscillator 80 outputs oscillation signal 56 (LO signal) at frequency $f_{lo}$, and the oscillation signal 56 is fed to a phase generation block 102, which produces N differential phases at frequency $f_{lo}$. Outputs of the phase generation block 102 are coupled to inputs of N differential ring oscillator stages of a ring oscillator 104. The N differential output phases of the phase generation block 102 are employed to lock the ring oscillator 104 of N differential stages. Outputs of the N differential ring oscillator stages are coupled to inputs of a differential edge combiner 106. The N differential ring oscillator stages generate N differential signals at the outputs of the ring oscillator, and the N differential signals at the outputs of the ring oscillator are combined by the differential edge combiner 106 to obtain the desired output frequency $f_{out}=N \cdot f_{lo}$ at an output 108 of the frequency multiplier 100.

Accordingly, the present disclosure may be regarded as being a combination of three blocks, e.g., phase generation is followed by an injection-locked ring oscillator and an edge combiner. In examples, N differential phase generation is followed by a differential injection-locked ring oscillator and a differential edge combiner. Examples of the present disclosure improves performance as will be described in the following. Combining N signals equally spaced in phase is an efficient way to realize a frequency multiplier by N. In order to perform a multiplication by N, N differential signals spaced by 360 degrees/2N may be combined. For example, to perform a multiplication by three, three differential signals spaced by 120 degrees each may be combined. The harmonic rejection of the frequency multiplier output is directly proportional to the quality of the phases at the input of the combiner, such as the edge combiner. If the signals are perfectly equally spaced in phase, the harmonic rejection is infinite and a single harmonic at $N \cdot f_{lo}$ appears in the output spectrum. In case the phases of the signals are not equally spaced, harmonics at multiples of $f_{lo}$ appear in the output spectrum. To produce the signals at the input of the combiner, the phase generator and the injection-locked ring oscillator are used. A trade-off exists between the quality of the phases produced over a defined bandwidth and the loss.

According to the present disclosure, the phase generation block is cascaded with a ring oscillator, which is easily injection-locked by the phases with multi-point injection. The effect is that the ring oscillator cleans up the phase error over process, voltage and temperature variations. In addition, using the ring oscillator enables locking over a very wide bandwidth so that phase errors over a wide frequency range may be cleaned up. In other words, the combination of a multi-phase generation followed by an injection-locked ring oscillator and an edge combiner allows in particular a generation of local oscillator signals used for frequency modulation with high suppression of harmonics.

In the following, examples of electronic circuits for implementing a phase generator, an injection-locked ring oscillator and a combiner are described referring to FIGS. 3 to 5. The examples are shown for the case of a differential multiplier by three, e.g., N=3. Of course, the implementation can be extended to other multiplication factors as desired. Moreover, it is clear that the corresponding electronic circuits could also be redesigned for single-ended signal processing, rather than differential signal processing.

In examples, the phase generator may be implemented using a poly-phase filter.

Figure 3:
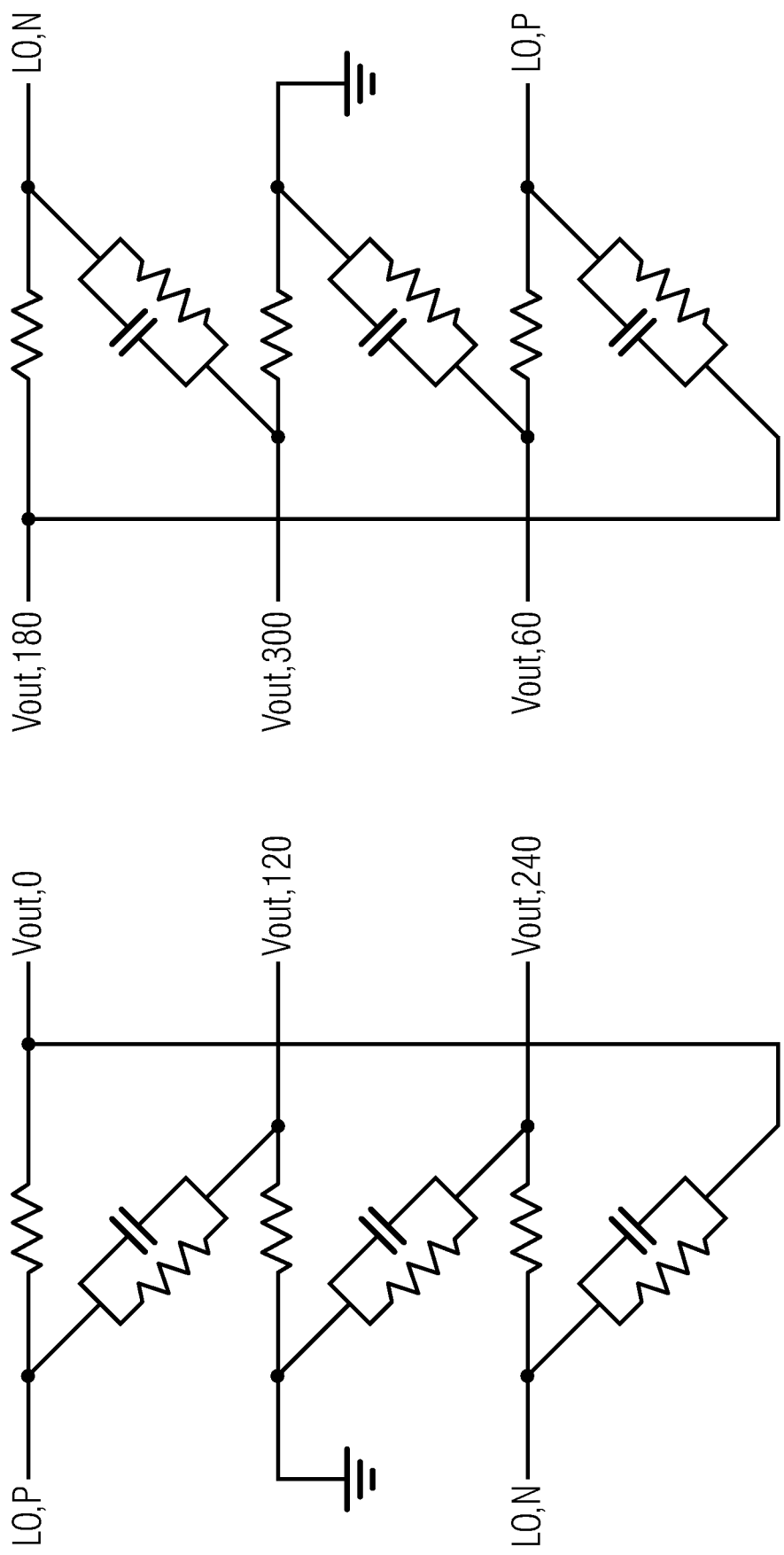
FIG. 3 shows a schematic diagram of a phase generator.

FIG. 3 shows a schematic diagram of a poly-phase filter (PPF) able to generate three differential phases spaced by 120 degrees, which may be used to implement the N differential phase generation block 102 of FIG. 2. In FIG. 3, LO,P and LO,N represent the two phases of a differential output signal of an oscillator, e.g., a phase difference between LO,P and LO,N is 180 degrees. The poly-phase filter comprises two inputs and N=3 differential outputs spaced by 120 degrees. To be more specific, the poly-phase filter outputs a first differential signal Vout,0 and Vout,180 at a first differential output, a second differential output signal Vout,120, Vout,300 at a second differential output and a third differential output signal Vout,240, Vout,60 at a third differential output. There is a phase shift of 120 degrees between each two of the differential output signals. As shown in FIG. 3, the poly-phase filter is implemented using resistors and capacitances, which are connected to each other in the manner shown in FIG. 3.

FIG. 3 shows a one-stage poly-phase filter. In examples of the present disclosure, usage of a one-stage poly-phase filter is sufficient since phase errors are subsequently cleaned up using the injection-locked ring oscillator.

In other examples, a multi-stage PPF filter may be used to implement the phase generator. In other examples, another circuit able to generate N phases may be used, such as a phase shifter having multiple tabs.

Figure 4:
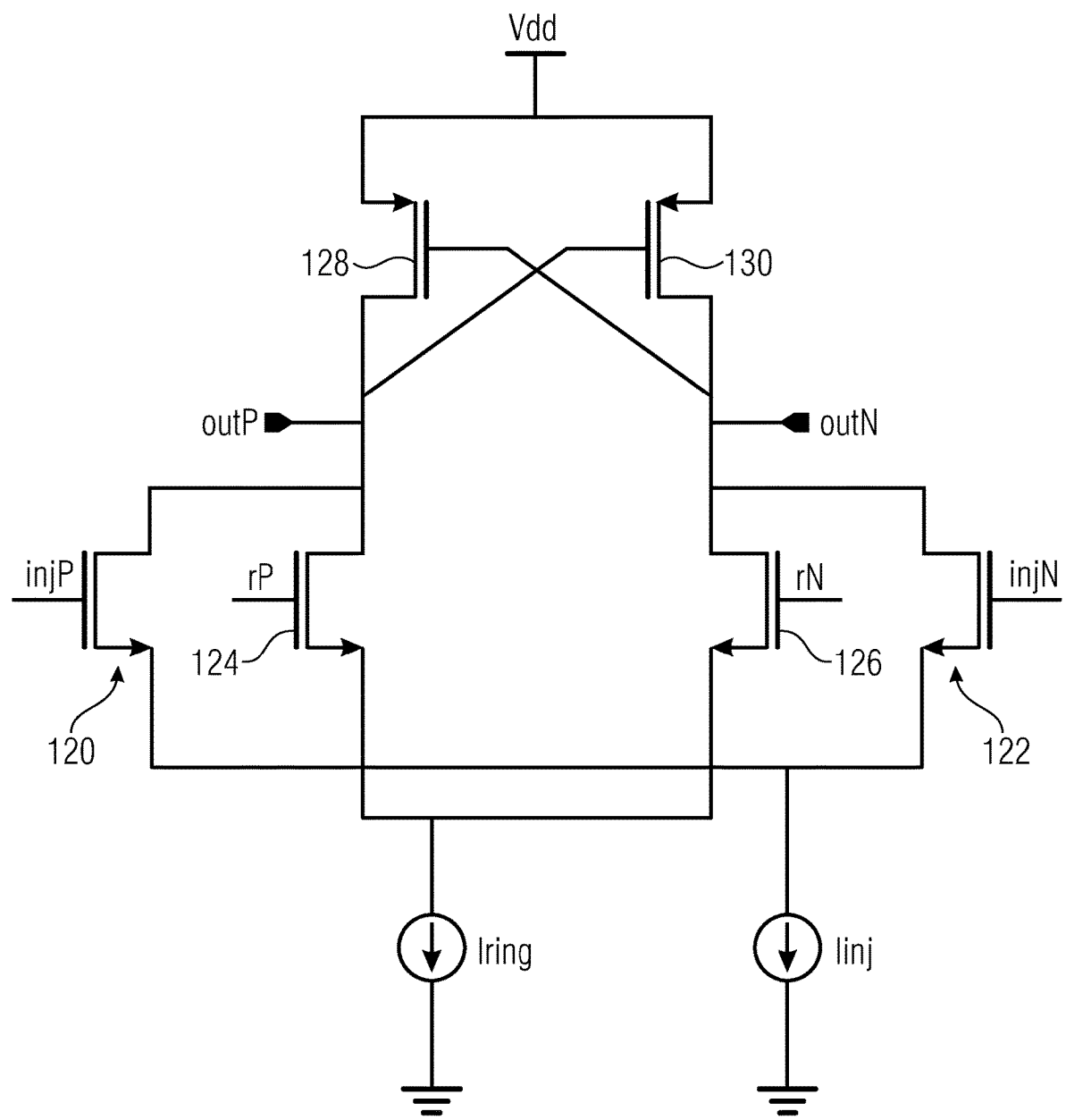
FIG. 4 shows a schematic diagram of an example of a stage of an injection-locked ring oscillator.

FIG. 4 shows a schematic view of a differential ring oscillator stage. The number of ring oscillator stages depends on N. In case of N=3, three differential stages (cells) of FIG. 4 will build the ring oscillator. In each stage, terminals rP and rN are connected to output terminals outP and outN of the previous stage so that the stages are connected in a ring. The differential output signal of the ring oscillator stage is output at the output terminals outP and outN. Terminals injP and injN represent a differential injection input of the ring oscillator stage. The differential input, e.g., injP and injN, is connected to a differential output of the phase generator, such as Vout,0 and Vout,180 in FIG. 3.

As shown in FIG. 4, the ring oscillator stage comprises injection transistors 120 and 122, inverter transistors 124, 126 and an active load, which is formed by load transistors 128, 130. Drain terminals of inverter transistor 124 and injection transistor 120 are connected to terminal outP of the differential output of the ring oscillator stage. Drain terminals of inverter transistor 126 and injection transistor 122 are connected to terminal outN of the differential output of the ring oscillator stage. Source terminals of inverter transistors 124, 126 are connected to a reference potential (such as ground) via a first current limiter Iring. Source terminals of injection transistors 120, 122 are connected to the reference potential, such as ground, via a second current limiter Iinj. Current limiters Iring and Iinj may be formed by current sources and provide bias currents for the ring oscillator stage, e.g. bias currents for a ring current of the ring oscillator and for an injection current of the respective stage.

Gate terminals of the inverter transistors 124 and 126 are connected to the terminals rP and rN, respectively. Gate terminals of the injection transistors 120 and 122 are connected to the terminals injP and injN, respectively.

The load formed of transistors 128, 130 is connected between a voltage source Vdd and the drain terminals of the injection transistors and inverter transistors.

Transistors 128 and 130 represent an active load, wherein source terminals of the load transistors are connected to the voltage source Vdd, a drain terminal of load transistor 128 is connected the drain terminal of inverter transistor 124, a drain terminal of load transistor 130 is connected to the drain terminal of inverter transistor 126, a gate terminal of the load transistor 128 is connected to the drain terminal of the load transistor 130, and the gate terminal of the load transistor 130 is connected to the drain terminal of the load transistor 128.

Multi-point ring injection is achieved by applying each different output signal of the phase generator to one differential control input of a different ring-oscillator stage, wherein the differential control input shown in FIG. 4 is formed by terminals injP and injN, which are connected to the gate terminals of the injection transistors 120, 122. Thus, injection transistors 120 and 122 of a respective ring-oscillator stage are controlled by one differential output of the phase generator.

In other examples, alternative ring oscillator stages may be used, such as ring oscillator stages comprising a resistive load instead of the active load, or ring oscillator stages with/without tail current generators and the like.

Thus, according to examples of the present disclosure, each stage of the injection coupled ring oscillator comprises an injection transistor configured to inject an injection current into the stage, wherein the phase generator output which is coupled to the stage is coupled to the control terminal of the injection transistor.

In examples of the present disclosure, the combiner is an edge combiner configured to combine the edges of the outputs of the ring oscillator stages into the output signals. In examples, the edge combiner comprises a set of transistors, wherein each of the output signal of the injection-locked ring oscillator is coupled to the control terminal of a different one of the set of transistors, wherein first terminals of the transistors of the set of transistors are coupled to a common voltage source and second terminals of the transistors of the set of transistors are coupled to a reference potential.

Figure 5:
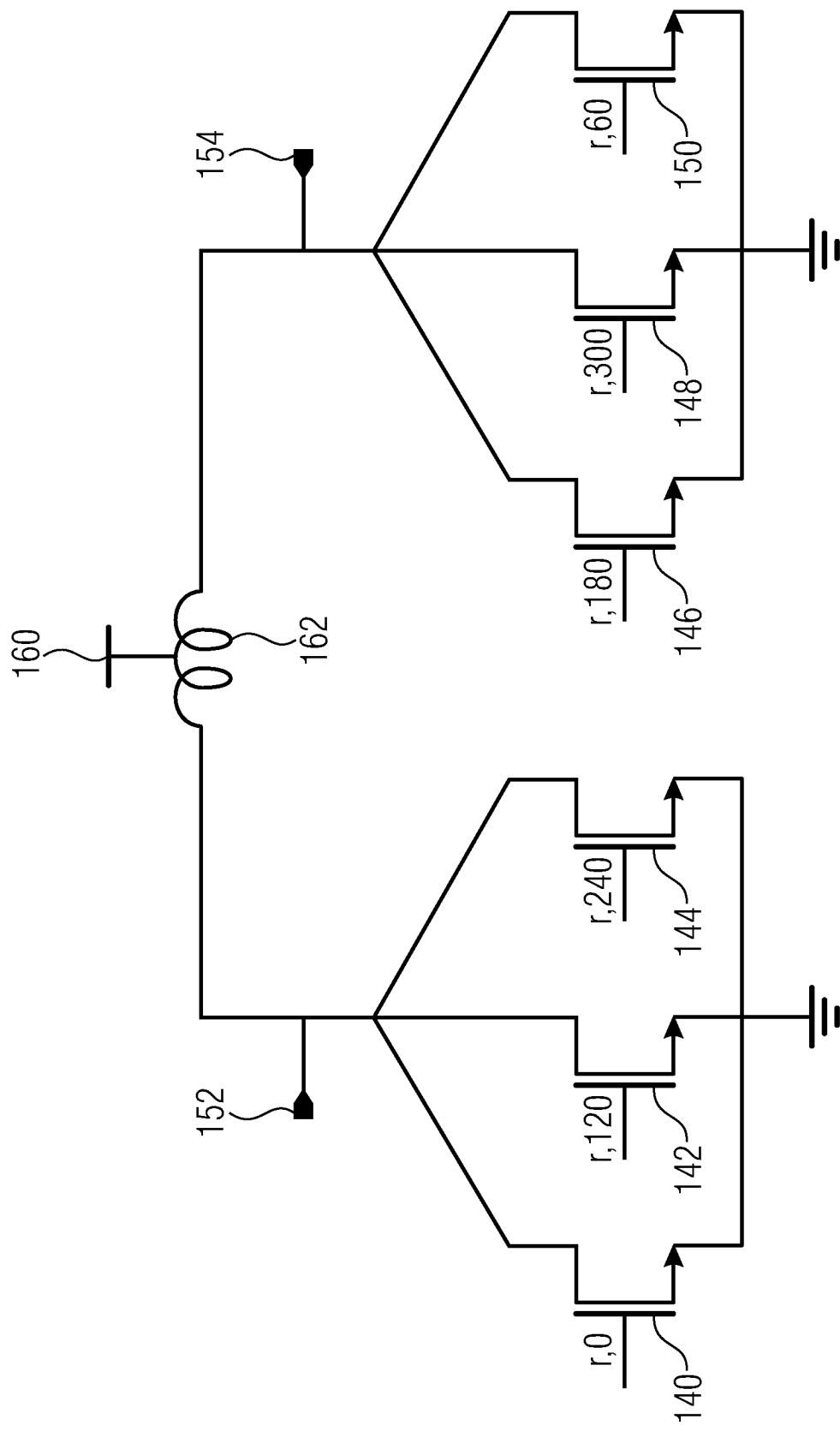
FIG. 5 shows a schematic diagram of an example of a combiner.

A schematic diagram of such an edge combiner is shown in FIG. 5. The edge combiner comprises transistors 140, 142, 144, 146, 148 and 150. Source terminals of the transistors 140 to 150 are connected to a reference potential, such as ground. Drain terminals of the transistors 140, 142, 144 are connected to a first terminal 152 of a differential output of the edge combiner and drain terminals of the transistors 146, 148 and 150 are connected to a second terminal 154 of a differential output of the edge combiner. Moreover, the differential outputs of the edge combiner are coupled to a common voltage source via a center tab of an inductor 162. In other examples, terminals 152 and 154 may be coupled to the common voltage source 160 via a tank circuit, such as a LC tank circuit or an RLC tank circuit. In other examples, there may be two current sources, one connected to transistors 140,142,144 and another one connected to transistors 146,148,150.

Gate terminals of the transistors 140 to 150 represent differential inputs of the edge combiner, e.g., terminals r,0 and r,180 represent a first differential input, terminals r,120 and r,300 represent a second differential input, and terminals r,240 and r,60 represent a third differential input. Each differential input of the edge combiner is coupled to the differential output of one ring oscillator stage. In other words, signals at the terminals r,i (i=0, 60, 120, 180, 240, 300) are the outputs of the ring oscillator. The edge combiner combines the edges of the signals at the terminals r,i in the current domain, thus producing at its terminal 152, 154 a signal with a frequency which is N times the frequency of the input signals.

In other examples of the edge combiner, a common gate architecture or a common drain architecture may be used instead of a common source architecture. In other examples, current bias may be used for the edge combiner.

In the examples described, the transistors are implemented using field effect transistors. In case of a field effect transistor, the gate terminal forms a control terminal, the drain terminal forms a first terminal and the source terminal forms a second terminal. In other examples, transistors may be implemented using bipolar transistors, wherein the base terminal forms a control terminal, the collector terminal forms a first terminal and the emitter terminal forms a second terminal.

Examples of the present disclosure may be applied to radar and communication systems, in which the frequency output by a local oscillator is to be multiplied to achieve a desired carrier frequency. Having a multiplier with high harmonic rejection ratio is beneficial for the emission mask and the up/down conversion of undesired signals. Examples of the present disclosure permit an increased harmonic rejection at the output of a frequency multiplier. On a system level, examples of the present disclosure allow for a better harmonic rejection specification. Examples of the present disclosure includes the cascade of a stage that generates N phases with low loss and in a narrow band fashion, followed by a ring oscillator that cleans up the phase errors over power, voltage and temperature variations and over a wide frequency range, followed by an edge combiner. Thanks to the preceding two blocks, the edge combiner is able to combine the N signals equally spaced in phase to produce at its output a harmonic at N times the input frequency with high harmonic rejection. In examples of the present disclosure, the phase generator is implemented using a single stage poly-phase filter with reduced losses when compared to multi-stage poly-phase filters. Thus, losses which would be induced by using filters having a higher number of stages or a larger bandwidth that would need to be recovered before the edge combiner with expensive power-consuming buffers may be avoided.

Figure 6:
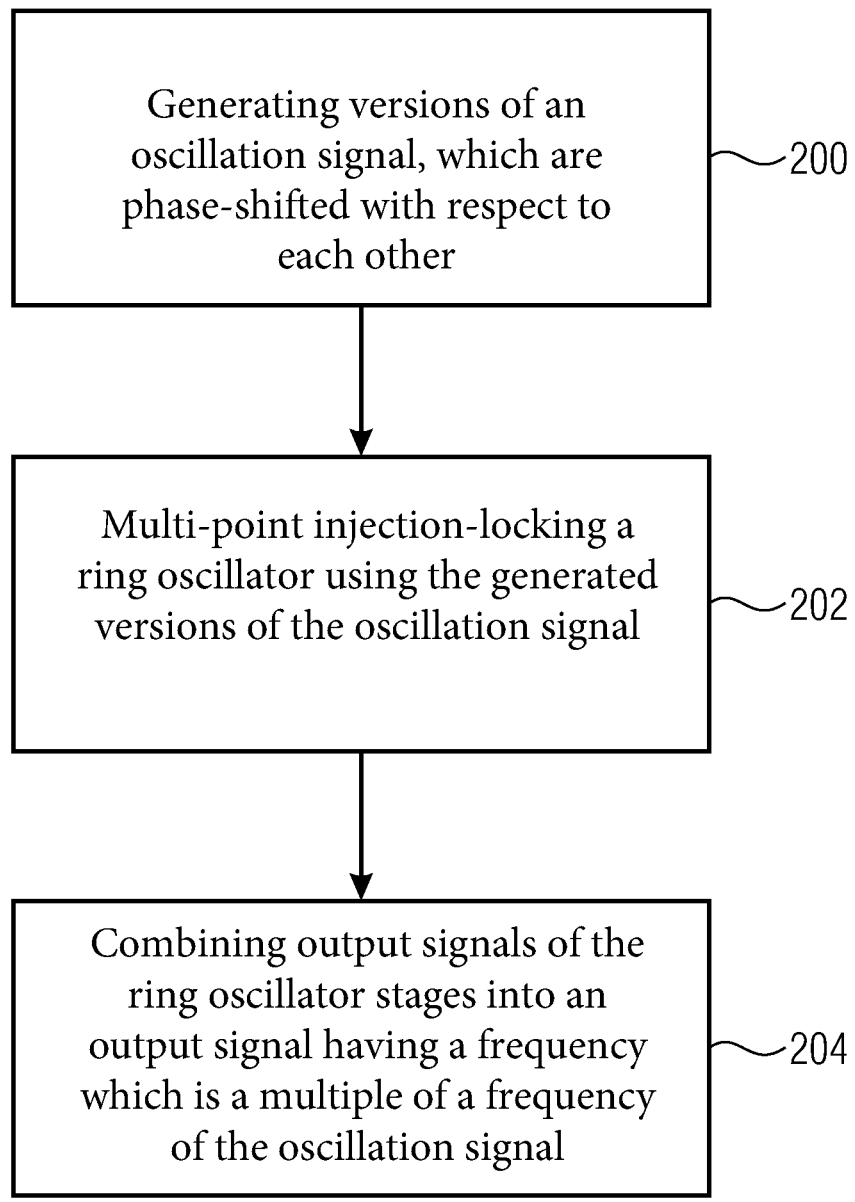
FIG. 6 shows a flow diagram of an example of a method for frequency multiplying according to the present disclosure.
Figure 7:
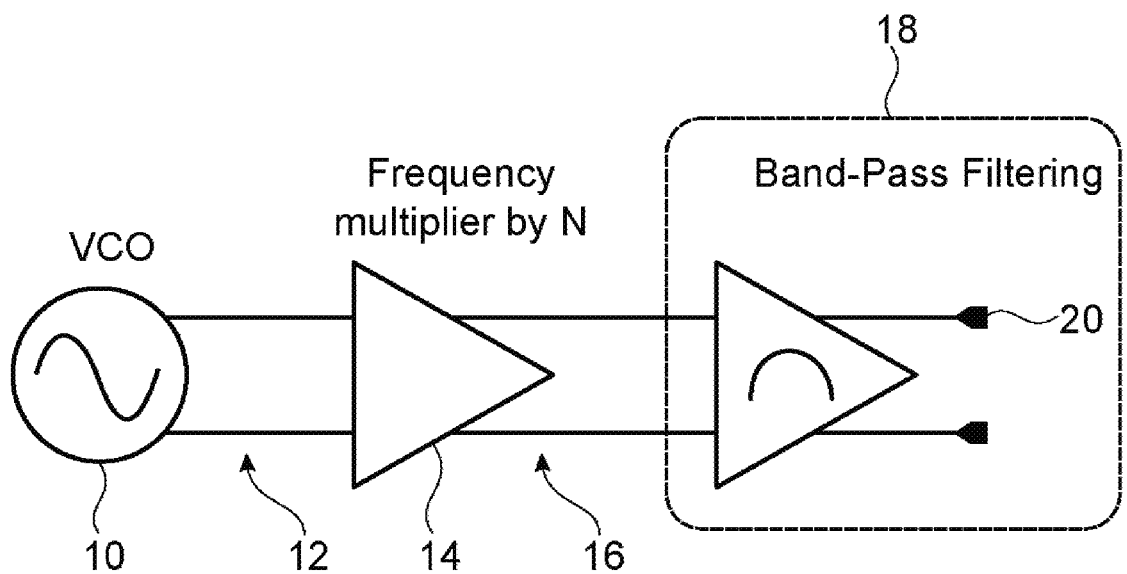
FIG. 7 shows a schematic diagram of a common approach for harmonic rejection.
Figure 8:
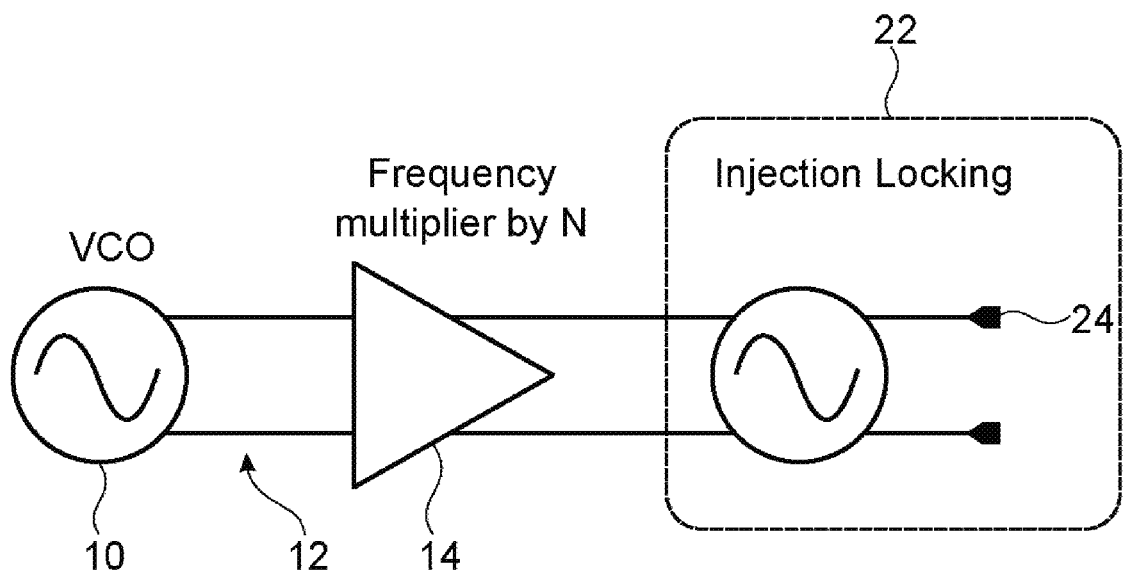
FIG. 8 shows a schematic diagram of another common approach for harmonics rejection.

Examples of the present application provide a method for frequency multiplying as shown in FIG. 6. At 200, versions of an oscillation signal, which are phase shifted with respect to each other are generated. At 202, a ring oscillator is multi-point injection-locked using the generated versions of the oscillation signal. At 204, output signals of stages of the ring oscillator are combined into an output signal having a frequency which is a multiple of a frequency of the oscillation signal.

In examples, the method comprises generating the oscillation signal with a varying frequency. In examples, the method comprises generating N versions of the oscillation signal which are phase-shifted by a phase shift of 360 degrees/N with respect to each other, injection locking N ring oscillator stages with the generated versions of the oscillation signal, and combining output signals of the N ring oscillator stages into the output signal having a frequency which is N times the frequency of the oscillation signal. In examples, the method comprises generating versions of the oscillation signal by applying the oscillation signal to a poly-phase filter. In examples, combining output signals of stages of the injection-locked ring oscillator comprises applying the output signals to an edge combiner configured to combine the edges of the output signals of the ring oscillator stages into the output signal. In examples, multi-point injection locking the ring oscillator comprises applying a respective generated version of the oscillation signal to a control terminal of an injection transistor of a respective ring oscillator stage. In examples of the method of the present disclosure, the oscillation signal is a differential signal, wherein the generated versions of the oscillation signal are differential signals and the output signal is a differential output signal.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

The above described examples are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

The invention claimed is:

1. A frequency multiplier comprising:
a phase generator configured to:
receive an oscillation signal, and
provide, at phase generator outputs, versions of the oscillation signal, which are phase-shifted with respect to each other;
an injection-locked ring oscillator comprising a plurality of stages,
wherein each of the phase generator outputs is directly connected to a different stage of the plurality of stages of the injection-locked ring oscillator for multi-point injection; and
a combiner configured to combine output signals of the plurality of stages of the injection-locked ring oscillator into an output signal having a frequency which is a multiple of a frequency of the oscillation signal.

2. The frequency multiplier of claim 1, wherein the phase generator comprises N phase generator outputs,
wherein the versions of the oscillation signal are phase-shifted by a phase shift of 360°/N with respect to each other,
wherein the injection-locked ring oscillator comprises N stages,
wherein the frequency of the output signal is N times the frequency of the oscillation signal, and
wherein N is an integer number equal to or larger than two.

3. The frequency multiplier of claim 1, wherein the phase generator comprises a poly-phase filter.

4. The frequency multiplier of claim 1, wherein the combiner is an edge combiner configured to combine edges of the output signals of the plurality of stages of the injection-locked ring oscillator into the output signal.

5. The frequency multiplier of claim 4, wherein the edge combiner comprises a set of transistors,
wherein each of the output signals of the plurality of stages of the injection-locked ring oscillator is provided to a control terminal of a respective transistor of the set of transistors, and
wherein first terminals of the set of transistors are coupled to a common voltage source and second terminals of the set of transistors are coupled to a reference potential.

6. The frequency multiplier of claim 1, wherein each stage of the plurality of stages of the injection-locked ring oscillator comprises an injection transistor configured to inject an injection current into a respective stage, and each of the phase generator outputs is coupled to a control terminal of a respective injection transistor.

7. The frequency multiplier of claim 1, wherein the oscillation signal is a differential signal, the phase generator is a differential phase generator, the phase generator outputs are differential phase generator outputs, the injection-locked ring oscillator is a differential injection-locked ring oscillator, and the combiner is a differential combiner.

8. The frequency multiplier of claim 7, wherein:
each stage of the plurality of stages of the differential injection-locked ring oscillator comprises a first injection transistor, a second injection transistor, a first inverter transistor, a second inverter transistor, and a load,
a first terminal of the first inverter transistor and a first terminal the first injection transistor are connected to a first terminal of a differential output of a respective stage,
a first terminal of the second inverter transistor and a first terminal of the second injection transistor are connected to a second terminal of the differential output of the respective stage,
a second terminal of the first inverter transistor and a second terminal of the second inverter transistor are connected to a reference potential via a first current limiter,
a second terminal of the first injection transistor and a second terminal of the second injection transistor are connected to the reference potential via a second current limiter,
the load is connected between a voltage source and the first terminals of the first inverter transistor and the second inverter transistor,
a control terminal of the first inverter transistor is connected to a first terminal of a differential output of another stage of the differential injection-locked ring oscillator,
a control terminal of the second inverter transistor is connected to a second terminal of the differential output of the other stage of the differential injection-locked ring oscillator, and
a control terminal of the first injection transistor and a control terminal of the second injection transistor are connected to one differential output of the differential phase generator.

9. The frequency multiplier of claim 8, wherein:
the load comprises a first load transistor and a second load transistor,
a first terminal of the first load transistor is connected to the first terminal of the first inverter transistor,
a first terminal of the second load transistor is connected to the first terminal of the second inverter transistor,
a second terminal of the first load transistor and a second terminal of the second load transistor are connected to the voltage source,
a control terminal of the first load transistor is connected to the first terminal of the second load transistor, and
a control terminal of the second load transistor is connected to the first terminal of the first load transistor.

10. A signal generator comprising:
an oscillator configured to generate an oscillation signal; and
a frequency multiplier comprising:
a phase generator configured to:
receive the oscillation signal, and provide, at phase generator outputs, versions of the oscillation signal, which are phase-shifted with respect to each other;

an injection-locked ring oscillator comprising a plurality of stages, wherein each of the phase generator outputs is directly connected to a different stage of the plurality of stages of the injection-locked ring oscillator for multi-point injection; and a combiner configured to combine output signals of the plurality of stages of the injection-locked ring oscillator into an output signal having a frequency which is a multiple of a frequency of the oscillation signal.

11. The signal generator of claim 10, wherein the oscillator is a voltage controlled oscillator configured to generate the oscillation signal with a variable oscillation frequency.

12. The signal generator of claim 10, wherein:

each stage of the plurality of stages of the injection-locked ring oscillator comprises a first injection transistor, a second injection transistor, a first inverter transistor, a second inverter transistor, and a load, a first terminal of the first inverter transistor and a first terminal of the first injection transistor are connected to a first terminal of an output of a respective stage, a first terminal of the second inverter transistor and a first terminal of the second injection transistor are connected to a second terminal of the output of the respective stage, a second terminal of the first inverter transistor and a second terminal of the second inverter transistor are connected to a reference potential via a first current limiter, a second terminal of the first injection transistor and a second terminal of the second injection transistor are connected to the reference potential via a second current limiter, the load is connected between a voltage source and the first terminals of the first inverter transistor and the second inverter transistor, a control terminal of the first inverter transistor is connected to a first terminal of an output of another stage of the injection-locked ring oscillator, a control terminal of the second inverter transistor is connected to a second terminal of the output of the other stage of the injection-locked ring oscillator, and a control terminal of the first injection transistor and a control terminal of the second injection transistor are connected to one output of the phase generator.

13. The signal generator of claim 12, wherein:

the load comprises a first load transistor and a second load transistor, a first terminal of the first load transistor is connected to the first terminal of the first inverter transistor, a first terminal of the second load transistor is connected to the first terminal of the second inverter transistor, a second terminal of the first load transistor and a second terminal of the second load transistor are connected to the voltage source, a control terminal of the first load transistor is connected to the first terminal of the second load transistor, and a control terminal of the second load transistor is connected to the first terminal of the first load transistor.

14. A method for frequency multiplying comprising:

generating versions of an oscillation signal which are phase-shifted with respect to each other;

providing the versions of the oscillation signal to an injection-locked ring oscillator comprising a plurality of stages, wherein each stage, of the plurality of stages, receives a different version, of the versions of the oscillation signal, for multi-point injection; and combining output signals of the plurality of stages of the injection-locked ring oscillator into an output signal having a frequency which is a multiple of a frequency of the oscillation signal.

15. The method of claim 14, further comprising:

generating the oscillation signal with a varying frequency.

16. The method of claim 14, wherein generating the versions of the oscillation signal comprises:

generating N versions of the oscillation signal which are phase-shifted by a phase shift of 360°/N with respect to each other, wherein N is an integer number equal to or larger than two;

wherein the injection-locked ring oscillator comprises:

N ring oscillator stages with the N versions of the oscillation signal; and wherein combining the output signals comprises:

combining output signals of the N ring oscillator stages into the output signal, wherein the frequency of the output signal is N times the frequency of the oscillation signal.

17. The method of claim 14, wherein generating the versions of the oscillation signal comprises;

applying the oscillation signal to a poly-phase filter.

18. The method of claim 14, wherein combining the output signals of the plurality of stages of the injection-locked ring oscillator comprises;

applying the output signals to an edge combiner configured to combine edges of the output signals.

19. The method of claim 14, wherein providing the versions of the oscillation signal to the injection-locked ring oscillator comprises:

applying a respective version of the oscillation signal to a control terminal of an injection transistor of a respective stage of the injection-locked ring oscillator.

20. The method of claim 14, wherein the oscillation signal is a differential signal, wherein the versions of the oscillation signal are differential signals, and wherein the output signals are differential output signals.

* * * * *

UNITED STATES PATENT AND TRADEMARK OFFICE
CERTIFICATE OF CORRECTION

PATENT NO.        : 11,005,485 B2                                    Page 1 of 1
APPLICATION NO.   : 16/447599
DATED             : May 11, 2021
INVENTOR(S)       : Mateo Bassi et al.

It is certified that error appears in the above-identified patent and that said Letters Patent is hereby corrected as shown below:

In the Claims

In Claim 17, Column 12, Line 38, "versions of the oscillation signal comprises;" should be changed to --versions of the oscillation signal comprises:--

In Claim 18, Column 12, Line 42, "locked ring oscillator comprises;" should be changed to --locked ring oscillator comprises:--

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*